United States Patent [19]
Durst et al.

[11] Patent Number: 5,585,622
[45] Date of Patent: Dec. 17, 1996

[54] OPTICAL SENSOR WITH MIRROR TOGGLING

[75] Inventors: David I. Durst, Syosset; Alvin Gartenberg, Dix Hills, both of N.Y.

[73] Assignee: Northrop Grumman Corporation, Los Angeles, Calif.

[21] Appl. No.: 409,362

[22] Filed: Mar. 23, 1995

[51] Int. Cl.$^6$ .................................................. H01J 40/14
[52] U.S. Cl. .................. 250/208.2; 250/332; 250/203.6
[58] Field of Search ............................ 250/208.1, 208.2, 250/208.4, 206.1, 206.2, 203.1, 203.2, 203.3, 203.4, 203.6, 208.3, 208.6, 332, 334, 338.1, 338.4

[56] References Cited

U.S. PATENT DOCUMENTS

| | | | |
|---|---|---|---|
| 3,551,680 | 12/1970 | Knight | 250/203.6 |
| 4,330,705 | 5/1982 | Kollodge | 250/203.6 |
| 4,675,532 | 6/1987 | Carson | 250/578 |
| 4,814,629 | 3/1989 | Arnold | 250/578 |
| 5,235,176 | 8/1993 | Noble et al. | 250/208.2 |
| 5,304,790 | 4/1994 | Arnold | 250/208.1 |
| 5,369,266 | 11/1994 | Nohda et al. | 250/208.1 |

Primary Examiner—Edward P. Westin
Assistant Examiner—John R. Lee
Attorney, Agent, or Firm—Terry J. Anderson; Karl J. Hoch, Jr.

[57] ABSTRACT

An optical sensor comprising a focal plane, a toggle mirror and an electronics plane. The focal plane includes a multitude of unit cells; and each of the unit cells has a given surface area on the focal plane and includes an optical detector, a real pixel and at least one virtual pixel. The optical detector of each unit cell includes a detector surface that defines the real pixel of the unit cell, and the optical detectors of the sensor are spaced apart and the virtual pixels of the sensor are formed by the spaces between the optical detectors. The toggle mirror directs an image onto the focal plane and steps each of the pixels of the focal plane over one of the optical detectors so that those detectors generate electric signals representing the intensity of light incident on the pixels. The electronics plane of the sensor includes a multitude of electronic circuits and each of these circuits receives and amplifies the electric signals from a respective one of the optical detectors. The electronics plane is located immediately rearward of the focal plane, and each of the electronic circuits has a substantially planar configuration and has a surface area on the electronics plane less that the given surface area of a respective one of the unit cells.

9 Claims, 4 Drawing Sheets

OPTICAL SENSOR WITH MIRROR TOGGLING

BACKGROUND OF THE INVENTION

This invention generally relates to optical sensors, and more specifically, to high resolution optical sensors such as staring sensors.

A staring optical sensor is usually a two-dimensional focal plane mosaic of photodetectors, each of which generates an electric current representing the intensity of light incident on a given area of observation, referred to as a pixel and representing one unit of resolution. Typically, the area behind each photodetector is used for electronic circuitry to amplify and multiplex the detector signal.

The coverage provided by a sensor is, generally, a function of the distance between neighboring detectors the smaller that distance, the better the coverage provided by the sensor. Ideally, the photodetector elements of an optical sensor are located immediately adjacent to each other. This forms an array of detectors with minimal space between the detectors, so that the array approaches 100% coverage of the image incident on the array.

The resolution of a staring optical sensor is, generally, a function of the distance between centers of adjacent detectors, referred to as the center to center spacing. The smaller this distance, the higher the resolution of the sensor. Thus, in a high resolution, high coverage sensor, the photodetectors are quite small and are located very close to each other. Under these circumstances, the space behind each detector for the required electronic circuitry is also very small, often resulting in the use of less than optimal electronic circuitry.

Increasing the spacing between detectors while keeping the size of the individual detectors fixed, increases the available area or space for the required electronic circuitry, but this also introduces undesirable gaps between detectors. With a sensor having such gaps, the image of a target of interest that falls within a gap between detectors would be invisible to the sensor until that image moved onto one of the detectors. The larger spacing between detector centers also reduces the spatial resolution of the sensor.

In the past, various approaches have been used to build high resolution, high coverage staring focal planes. One approach has been, simply, to keep the detector size large enough to accommodate an optimally functioning electronic circuitry. With another approach, higher density integrated circuits or lower functioning circuits are used to minimize the circuit area needed, allowing the use of smaller detectors. Either approach compromises the overall performance of the sensor.

SUMMARY OF THE INVENTION

An object of this invention is to improve optical sensors.

Another object of the present invention is to increase the resolution of a staring optical sensor without requiring a smaller electronic circuitry to process the electronic signals from the detectors of the sensor.

A further object of this invention is to step a plurality of pixel areas of an optical sensor over a single optical detector to eliminate the need to provide the sensor with a respective one electrical circuitry for each of those pixel areas.

Another object of this invention is to operate an array of small area photodetectors, with large gaps between them, as a fully populated focal plane with no gaps in coverage.

An object of the present invention is to use mirror toggling to reduce the detector area of an optical sensor while providing as wide a gap between detectors as needed to fit the necessary circuitry in the unit cell defined by each detector.

These and other objectives are attained with an optical sensor comprising a focal plane, a toggle mirror and an electronics plane. The focal plane includes a multitude of unit cells; and each of the unit cells has a given surface area on the focal plane and includes an optical detector, a real pixel and at least one virtual pixel. The optical detector of each unit cell includes a detector surface that defines the real pixel of the unit cell, and the optical detectors of the sensor are spaced apart and the virtual pixels of the sensor are formed by the spaces between the optical detectors. The toggle mirror of the sensor is provided to direct an image onto the focal plane and to step each of the pixels of the focal plane over one of the optical detectors of the sensor so that those optical detectors generate electric signals representing the intensity of light incident on the pixels.

The electronics plane of the sensor includes a multitude of electronic circuits; and each of these circuits includes an input line, an amplifier and an output line. In each circuit, the input line receives electric signals from a respective one of the optical detectors, the amplifier is connected to the input line to amplify the electric signals from the respective one of the optical detectors, and the output line is connected to the amplifier to receive the amplified signals therefrom. The electronics plane is located immediately rearward of the focal plane, and each of the electronic circuits has a substantially planar configuration and has a surface area on the electronics plane less than the given surface area of a respective one of the unit cells.

Preferably, each of the electronic circuits is electrically connected to, and receives the electric signals from the optical detector of, an associated one of the unit cells. The area of each of the electronic circuits on the electronics plane is entirely contained within an area projected directly rearward onto the electronics plane from the given area on the focal plane of the associated one of the unit cells. With this configuration, and with the use of mirror toggling, the detector area may be made as small as desired while providing as wide a gap between detectors as needed to fit the necessary circuitry in the unit cell defined by each detector.

Further benefits and advantages of the invention will become apparent from a consideration of the following detailed description given with reference to the accompanying drawings, which specify and show preferred embodiments of the invention.

DETAILED DESCRIPTION OF THE PREFERRED EMBODIMENTS

Figure 1:
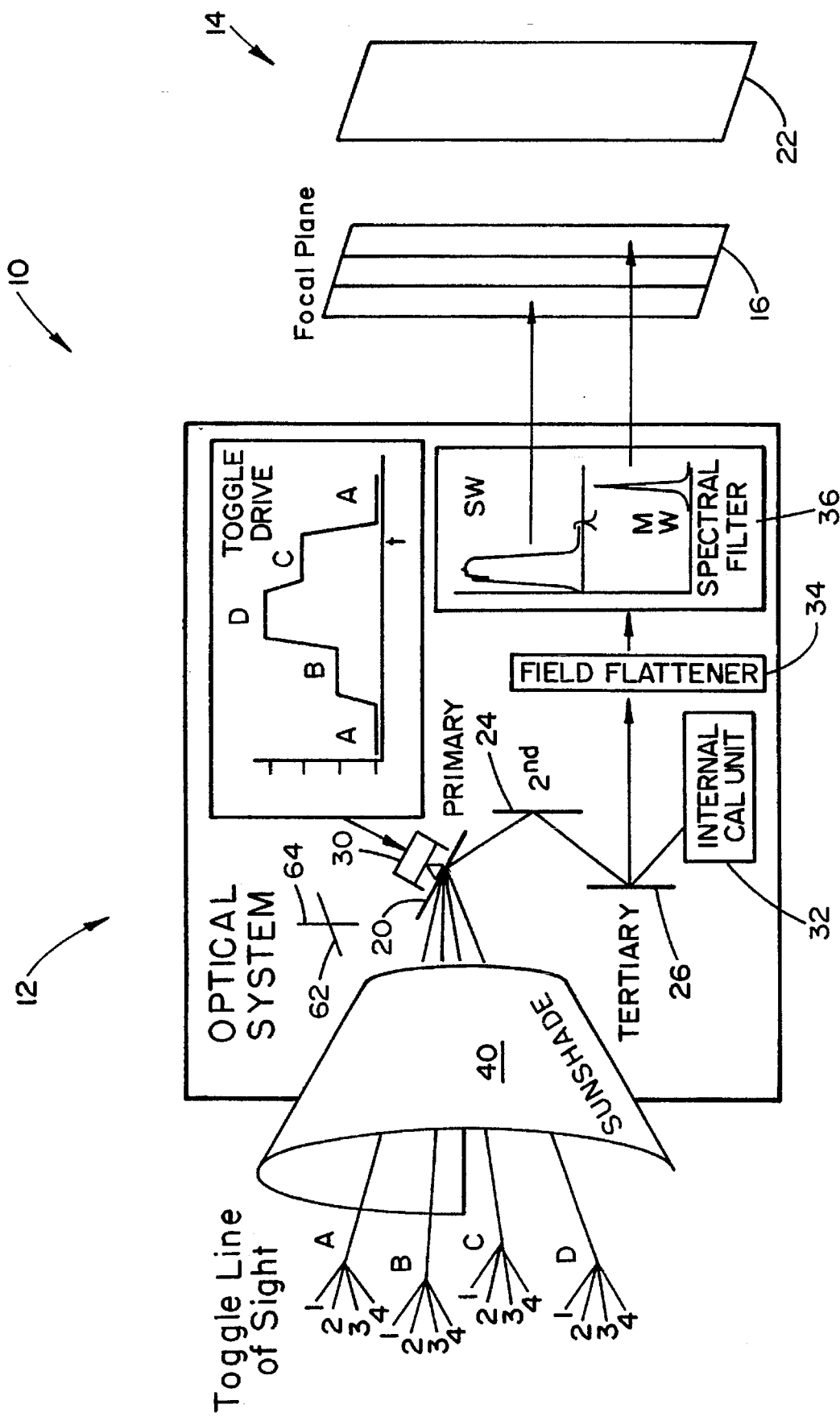
FIG. 1 diagrammatically illustrates an optical sensor embodying the present invention.
Figure 2:
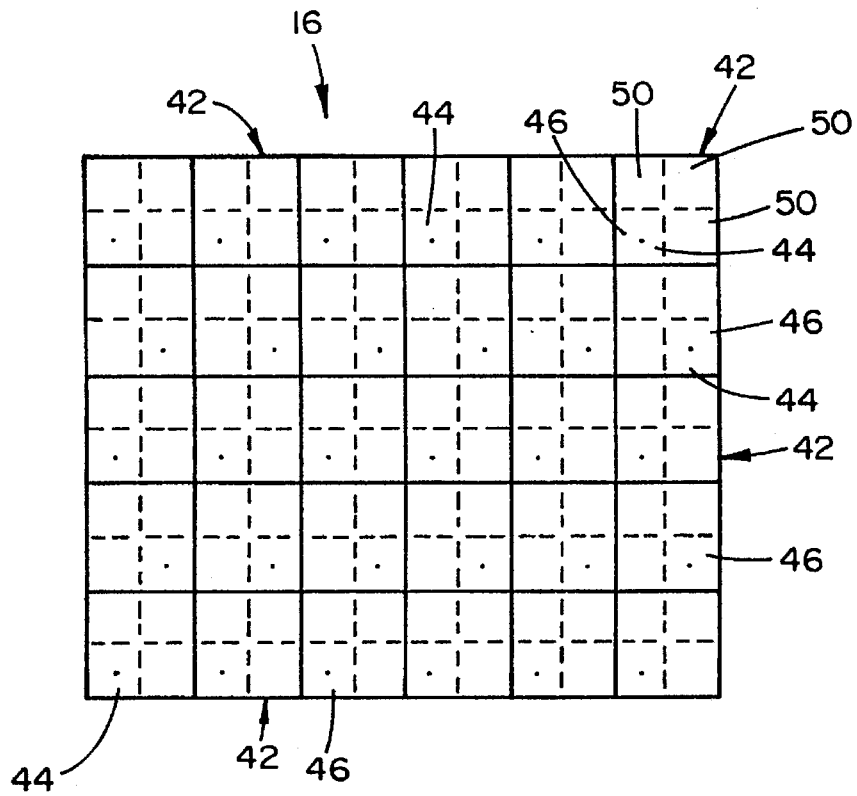
FIG. 2 diagrammatically illustrates a portion of the focal plane of the optical sensor.
Figure 3:
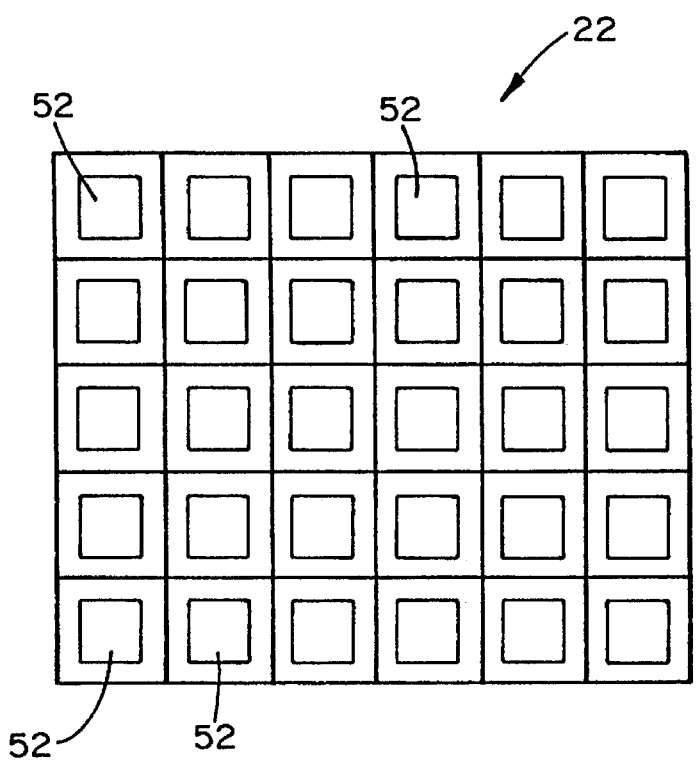
FIG. 3 diagrammatically illustrates a portion of the electronic circuitry plane of the optical sensor.
Figure 4:
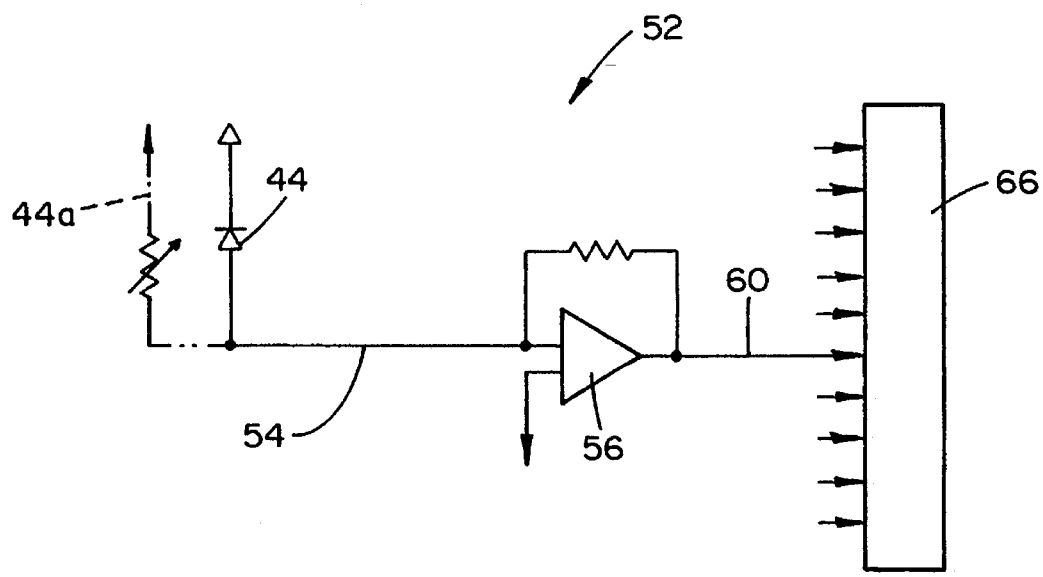
FIG. 4 is a schematic diagram of the preferred electronic circuitry associated with each optical detector of the optical sensor.

FIG. 1 illustrate optical sensor 10 including optical system 12 and electronic system 14. Optical system 12 includes focal plane 16 and toggle mirror 20, and electronic system 14 includes electronics plane 22. As illustrated in FIG. 1, optical system 12 also includes additional mirrors 24 and 26, toggle drive 30, calibration unit 32, field flattener 34, filter 36 and sun shade 40. With reference to FIG. 2, focal plane 16 includes a multitude of unit cells 42, each of which includes a photodetector 44, a first pixel 46, referred to as a real pixel, and at least one second pixel 50, referred to as a virtual pixel. Electronics plane 22 is located immediately rearward of focal plane 16, and with reference to FIG. 3, plane 22 includes a multitude of circuits, represented by blocks 52. As shown in FIG. 4, each of these circuits 52 includes an input line 54, amplifier 56 and output line 60.

In sensor 10, optical detector 44 of each unit cell 42 includes a detector surface that defines the real pixel 46 of the unit cell, and the optical detectors of the sensor are spaced apart and the virtual pixels 50 of the sensor are formed by the spaces between the optical detector. Also, each of the unit cells 42 has a given surface area on focal plane 16, and each of electronic circuits 52 has a substantially planar configuration and has a surface area on electronics plane 22 less than the given surface area of a respective one of the unit cells.

Generally, optical detectors 44 generate electric signals representing the intensity of light incident on the detector, and a respective one of the circuits 52 is associated with each of the optical detectors for receiving and amplifying signals generated by the optical detector. Mirror 20 is supported for pivotal movement about two perpendicular axis, represented by axes 62 and 64 shown in FIG. 1; and toggle mirror 20 is used to shift, or toggle, the image incident on focal plane 16 so that each of the pixels 46 and 50 of sensor 10 are stepped over one of optical detectors 44 thereof. In this way, for each pixel 46 and 50 of sensor 10, optical detectors 44 generate at least one electric signal representing the intensity of the light incident on the pixel.

With the embodiment of sensor 10 illustrated in the drawings, each of the electronic circuits 52 is electrically connected to, and receives the electric signals from, the optical detector 44 of an associated one of the unit cells 42, and the surface area of each of the electronic circuits is less than the given surface area of that associated one of the unit cells. In addition, preferably, each of electronic circuits 52 is located directly rearward of the associated one of unit cells 42. Even more specifically, the area of each of the electronic circuits 52 on electronics plane 22 is entirely contained within an area projected rearward onto the electronics plane from the given area of the associated one of the unit cells on focal plane 16.

An optical technique, including the configuration of focal and electronic planes 16 and 22 and the use of mirror toggling, as described above, permits the detector area to be made as small as desired while providing as wide a gap between detectors as needed to fit the necessary circuitry in the unit cell defined by each detector.

More specifically, with particular reference to FIG. 2, detectors 44 are located in a common plane and form or define the focal plane. Preferably, optical detectors 44 are spaced apart in a regular two-dimensional array, and the area immediately forward of each detector forms and defines a real pixel. The virtual pixels of sensor are formed by the area of the focal plane between the optical detectors.

Preferably, the detector array is configured in a pattern such that each detector 44 is located within a unit cell 42 whose area is $N^2$ (where N is an integer) times the area of the associated optical detector. The embodiment of optical sensor 10 shown in FIGS. 1 through 3 illustrates the case where N equals two. Also as shown in FIG. 2, each unit cell 42 forms one real pixel 46 and three virtual pixels 50.

Moreover, each unit cell 42 has a square shape and is divided into four pixels. The real pixel 46 of each unit cell 42 has a square shape, and is approximately ¼th the size of the unit cell. The remaining, or virtual, pixels of each unit cell 42 are formed from the remaining area of the unit cell—that is, the area of the unit cell outside the real pixel 46 of the cell. Preferably, that remaining area is divided into three virtual pixels 50 and these virtual pixels have identical shapes and sizes, which are identical to the shape and size of the real pixel of the unit cell. In addition, preferably, unit cells 42 are identical, and these cells are arranged in a regular two dimensional array.

As will be understood by those of ordinary skill in the art, unit cell 42 may have more or fewer pixels than are shown in FIG. 2; and, further, the pixels of the unit cell, and the unit cell itself, may have shapes other than a square. For instance, unit cell 42 may have two rectangular pixels, one real and one virtual. Alternatively, the unit cell may have eight rectangular pixels, one real and seven virtual, arranged in a 4-by-2 array.

In operation, the mirror 20 toggles or steps in angles about one or both axes 62 and 64 so as to cause the image to step across the detector array in pattern that fills in all the blanks of detector coverage. In a preferred arrangement—where a unit cell 42 has an area $N^2$ (where N is an integer) times the area of the associated optical detector—this preferred toggling requires $N^2$ steps.

Figure 5:
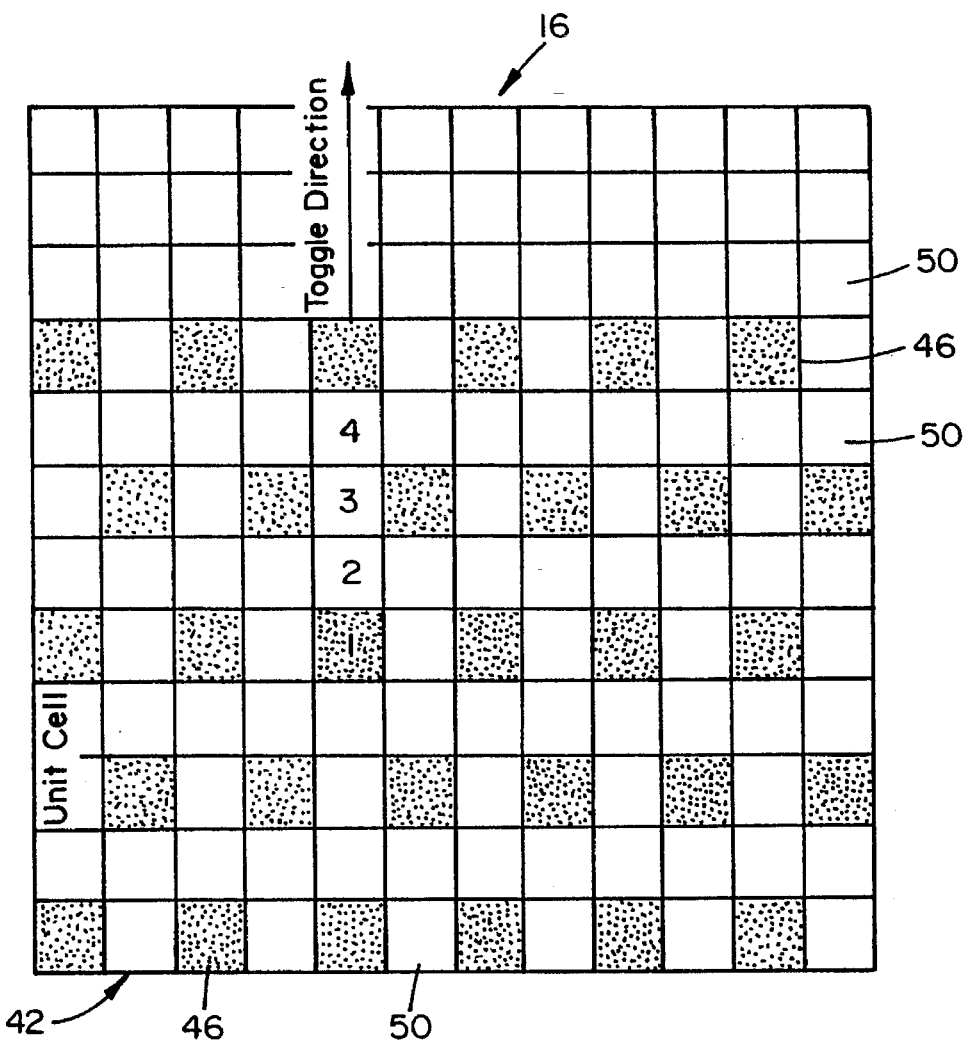
FIGS. 5–7 illustrates various procedures for steping pixels of the sensor over an optical detector.
Figure 6:
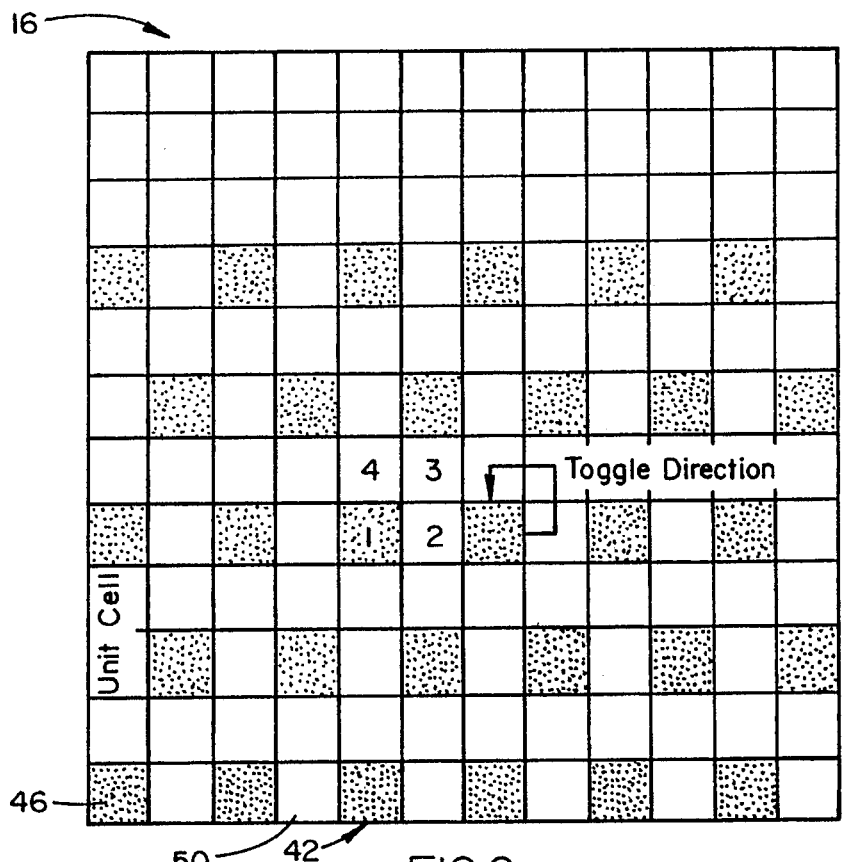

Mirrors 20, 24, and 26 may be used to toggle the pixels 46 and 50 of sensor 10 over optical detectors 44 thereof in any suitable pattern. For example, with reference to FIG. 1 and 5, mirror 20 may be pivoted back and forth about one axis to step a group of linearly arranged pixels, one pixel at a time, over each optical detector 44. Alternatively, with reference to FIGS. 1 and 6, mirror 20 may be pivoted about both axes 62 and 64 to step a block of neighboring pixels, one pixel at a time, over each optical detector 44.

Figure 7:
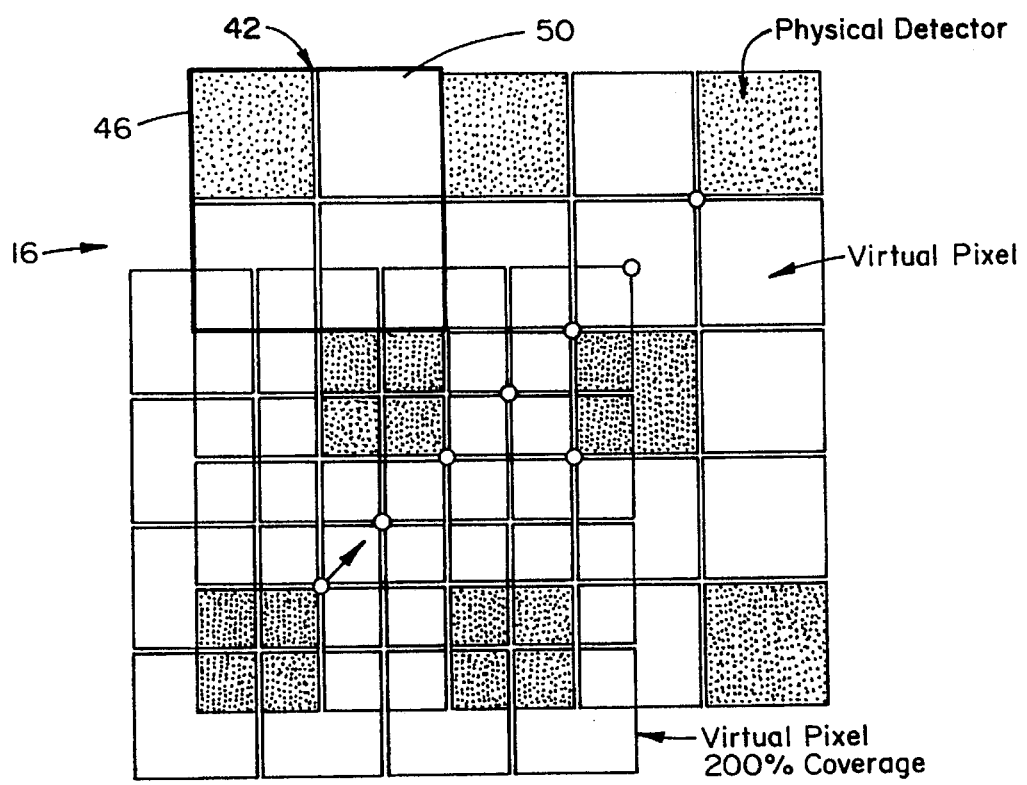

When the center-to-center spacing of detectors 44 is exactly N times the width of a detector, then after N toggles, the focal plane 16 exhibits 100% coverage of the image. Furthermore, when the center-to-center spacing of detectors 44 is made less than N times the width of a detector, the focal plane 16 exhibits greater than 100% coverage, or overlapping coverage, of the image. This would be impossible to achieve without toggling. In addition, by rotating the toggle axes 62 and 64 of mirror 20 by forty—five degrees, and doubling the number of toggle steps to 2N, it is possible to cause an overlap of detector areas and to produce 200% coverage of the image and a center-to-center spacing that is $\sqrt{2}$ closer. This improves the sensor resolution, as shown in FIG. 7.

With reference again to FIG. 1, mirror 20 may be supported in any suitable manner, and any suitable drive means 30 may be used to move or toggle the mirror in the desired manner. Internal calibration unit 32 may be employed to adjust the focus of mirror 20, and field flattener 34 may be included in optical system 12 to compensate for any distortion or bending introduced into the transmitted image in the optical system. In addition, filter 36 may be located in the path of the transmitted image, between mirror 20 and focal plane 16, and the filter 36 may be used to alternately transmit light in two different frequency bands, allowing an independent inspection of each of those frequency bands. For instance, filter 36 may alternately transmit green and blue light onto focal plane 16. Optical system 12 may be provided with additional elements, for example, to process the optical image transmitted through the system.

FIG. 4 shows in greater detail the electronic circuitry associated with a single photodetector. Detector 44 has its output connected to input line 54, which conducts current from the photodetector to preamplifier 56, and this amplifier feeds its output, via output line 60, to multiplexer 66. Multiplexer 66 has parallel input branches from other detector circuits, and a control circuit (not shown) to control or identify the output signals conducted off the multiplexer.

The circuit of FIG. 4 is designed for the use of photovoltaic detectors. If photo-conductive detectors are used, an exterior current source 44a (shown in phantom) is included. Photodetectors 44, amplifiers 56 and multiplexer 66 may be standard, conventional elements. Also, one or more filters (not shown) may be included in circuit 52 shown in FIG. 4, either to process the electric signals conducted through the circuit or to select particular frequencies or frequency bands for transmission through the circuit.

In operation, an image, or a portion of an image, is incident, via mirrors 20, 24 and 26, on focal plane 16. Mirror 20 is operated to step each of pixels 46 and 50 of sensor 10 over optical detectors 44 thereof; and in particular, each group of pixels is stepped, one pixel at a time, over one, or more, of the detectors 44. Each of the detectors 44 generates a set of electric signals representing the intensities of light incident on the pixels stepped over the detector; and specifically, as each pixel is stepped across one of the optical detectors, that detector generates an electric signal representing the intensity of light incident on the pixel. These signals are conducted to amplifier 56, which then amplifies the received signals, and the amplified signals are applied to multiplexer 66.

This invention, as described above, permits an array of small area photodetectors with relatively large gaps between them to function as a fully populated focal plane with no gaps in coverage. Each detector can then be serviced by electronic circuitry occupying a much larger area than the detector itself. With the toggled focal plane, it is possible to obtain coverage and resolution greater than that which could be achieved with a fully populated detector array.

While it is apparent that the invention herein disclosed is well calculated to fulfill the objects previously stated, it will be appreciated that numerous modifications and embodiments may be devised by those skilled in the art, and it is intended that the appended claims cover all such modifications and embodiments as fall within the true spirit and scope of the present invention.

What is claimed is:

1. An optical sensor comprising:
    a focal plane including a multitude of unit cells, each of the unit cells having a given surface area on the focal plane and including an optical detector, a real pixel and at least one virtual pixel; wherein the optical detector of each unit cell includes a detector surface defining the real pixel of the unit cell, and the optical detectors of the sensor are spaced apart and the virtual pixels of the sensor are formed by the spaces between the optical detectors;
    a toggle mirror to direct an image onto the focal plane and to step each of the real and virtual pixels of the focal plane over one of the optical detectors, wherein the optical detectors generate electric signals representing the intensity of light incident on the pixels; and
    an electronics plane including a multitude of electronic circuits, each of the electronic circuits including
        i) an input line for receiving electric signals from a respective one of the optical detectors,
        ii) an amplifier connected to the input line to amplify the electric signals from said respective one of the optical detectors; and
        iii) an output line connected to the amplifier to receive the amplified signals therefrom;

wherein the electronics plane is located immediately rearward of the focal plane, and each of the electronic circuits has a substantially planar configuration and has a surface area on the electronics plane less than the given surface area of a respective one of the unit cells.

2. An optical sensor according to claim 1, wherein
    each of the electronic circuits is electrically connected to, and receives the electric signals from the optical detector of, an associated one of the unit cells; and
    the surface area of each of the electronic circuits is less than the given surface area of the associated one of the unit cells.

3. An optical sensor according to claim 2, wherein each of the electronic circuits is located directly rearward of the associated one of the unit cells.

4. An optical sensor according to claim 1, wherein the area of each of the electronic circuits on the electronics plane is entirely contained within an area projected rearward onto the electronics plane from the given area, of the associated one of the unit cells, on the focal plane.

5. An optical sensor according to claim 1, wherein each of the unit cells is divided into a group of pixels having equal areas, one of the pixels of said group of pixels is the real pixel of the unit cell, and the other pixels of said group of pixels are virtual pixels of the unit cell.

6. An optical sensor according to claim 1, wherein
    the front surface of the optical detector of each unit cell has a given area; and
    the surface area of each unit cell is $N^2$ times the area of the front surface of the optical detector of the unit cell, where N is an integer.

7. An optical sensor comprising:
    a multitude of units, each of the units consisting of
        i) a real pixel,
        ii) a plurality of virtual pixels,
        iii) an optical detector for generating electric signals representing the intensity of light incident on the real and virtual pixels, and
        iv) an electric circuit for receiving and amplifying the electric signals from the optical detector; and
    a toggle mirror to step the real and virtual pixels of the sensor over the optical detectors of the sensor;
    wherein the pixels of the units define a focal plane and the electric circuits of the units define an electronics plane located immediately behind the focal plane;
    wherein the optical detector of each unit includes a detector surface defining the real pixel of the unit, and the optical detectors of the sensor are spaced apart and the virtual pixels of the sensor are formed by the spaces between the optical detectors; and
    wherein the pixels of each unit extend over a given area of the focal plane, and the electric circuit of each unit is located directly behind, and is entirely contained within an area located directly behind, the pixels of the unit.

8. An optical sensor according to claim 7, wherein the pixels of each of the units have equal areas.

9. An optical sensor according to claim 7, wherein:
    the front surface of the optical detector of each unit has a given area; and
    the area on the focal plane of the pixels of each unit is $N^2$ times the area of the front surface of the optical detector of the unit, where N is an integer.

* * * * *